United States Patent
Chang et al.

(10) Patent No.: US 11,700,689 B2
(45) Date of Patent: Jul. 11, 2023

(54) CIRCUIT BOARD

(71) Applicant: HTC Corporation, Taoyuan City (TW)

(72) Inventors: Che-Jung Chang, Taoyuan City (TW); Chia-Chu Ho, Taoyuan City (TW); Wei-Hong Gao, Taoyuan City (TW)

(73) Assignee: HTC Corporation, Taoyuan City (TW)

( * ) Notice: Subject to any disclaimer, the term of this patent is extended or adjusted under 35 U.S.C. 154(b) by 0 days.

(21) Appl. No.: 17/462,003

(22) Filed: Aug. 31, 2021

(65) Prior Publication Data
US 2023/0060601 A1 Mar. 2, 2023

(51) Int. Cl.
H05K 1/02 (2006.01)
H05K 1/11 (2006.01)
H01Q 1/22 (2006.01)

(52) U.S. Cl.
CPC ............ H05K 1/115 (2013.01); H01Q 1/2283 (2013.01); H05K 1/0237 (2013.01); H05K 1/118 (2013.01)

(58) Field of Classification Search
CPC ....... H05K 1/115; H05K 1/0237; H05K 1/118; H05K 1/0216-0235; H01Q 1/2283; H05K 2201/0715; H05K 2201/09618; H01P 3/085;
See application file for complete search history.

(56) References Cited

U.S. PATENT DOCUMENTS

2010/0182105 A1* 7/2010 Hein et al. ........... H05K 1/0219
333/239
2017/0330825 A1* 11/2017 Chou et al. ...... H01L 23/49838
2019/0067768 A1 2/2019 Baba
2020/0266519 A1* 8/2020 Lee et al. ............. H05K 1/189
2020/0343202 A1* 10/2020 Wang et al. ........ H05K 1/0245
2022/0232708 A1 7/2022 Ikemoto

FOREIGN PATENT DOCUMENTS

| JP | H04313300 | 11/1992 |
| JP | 2008109228 | 5/2008 |
| WO | 2018135475 | 1/2019 |
| WO | 2021095642 | 5/2021 |

OTHER PUBLICATIONS

"Office Action of Japan Counterpart Application", issued on Dec. 13, 2022, p1-p4.

* cited by examiner

*Primary Examiner* — Roshn K Varghese
(74) *Attorney, Agent, or Firm* — JCIPRNET

(57) ABSTRACT

A circuit board includes a first layer, a second layer, a third layer, a plurality of plating through holes, at least one first intermediate layer and at least one second intermediate layer. The first layer and the second layer are used as reference voltage planes. A plurality of transmission wires are disposed on the third layer. The transmission wires are coupled to a wireless signal transceiver and a plurality of antenna arrays; wherein the third layer is disposed between the first layer and the second layer. The plating through holes are disposed at sides of the third layer, wherein the plurality of plating through holes are configured to connect the first reference voltage plane with the second reference voltage plane. The first intermediate layer is disposed between the first layer and the third layer, and the second intermediate layer is disposed between the second layer and the third layer.

7 Claims, 4 Drawing Sheets

CIRCUIT BOARD

BACKGROUND

Technical Field

The disclosure relates to a circuit board, and in particular, relates to a circuit board that can reduce a conductive loss for signal transmission.

Description of Related Art

In the related art, about intermediate frequency (IF) signal transmission, there is strict requirement about conductive loss. For this requirement, conventional art usually uses material with high cost for circuit board implementation and routs the transmission wires with limitations. It should be noted here, IF routing is always the bottleneck in the circuit board, especially integrated with multiple mm-wave antenna arrays disposed in different locations of the circuit board.

SUMMARY

The disclosure provides a circuit board that can reduce conductive loss of a transmitted signal on transmission wires.

The circuit board includes a first layer, a second layer, a third layer, a plurality of plating through holes, at least one first intermediate layer and at least one second intermediate layer. The first layer is used as a first reference voltage plane. The second layer is used as a second reference voltage plane. A plurality of transmission wires are disposed on the third layer, wherein first ends of the plurality of transmission wires are coupled to a wireless signal transceiver, and second ends of the plurality of transmission wires are coupled to a plurality of antenna arrays, wherein the third layer is disposed between the first layer and the second layer. The plating through holes are disposed at sides of the third layer, wherein the plurality of plating through holes are configured to connect the first reference voltage plane with the second reference voltage plane. The first intermediate layer is disposed between the first layer and the third layer, and the second intermediate layer is disposed between the second layer and the third layer.

To sum up, by increasing a distance between the transmission wires and the reference voltage plane, a width of the transmission wires can be increased correspondingly, a conductive loss of the transmission wires can be reduced to meet a requirement of specification.

DESCRIPTION OF THE EMBODIMENTS

Figure 1:
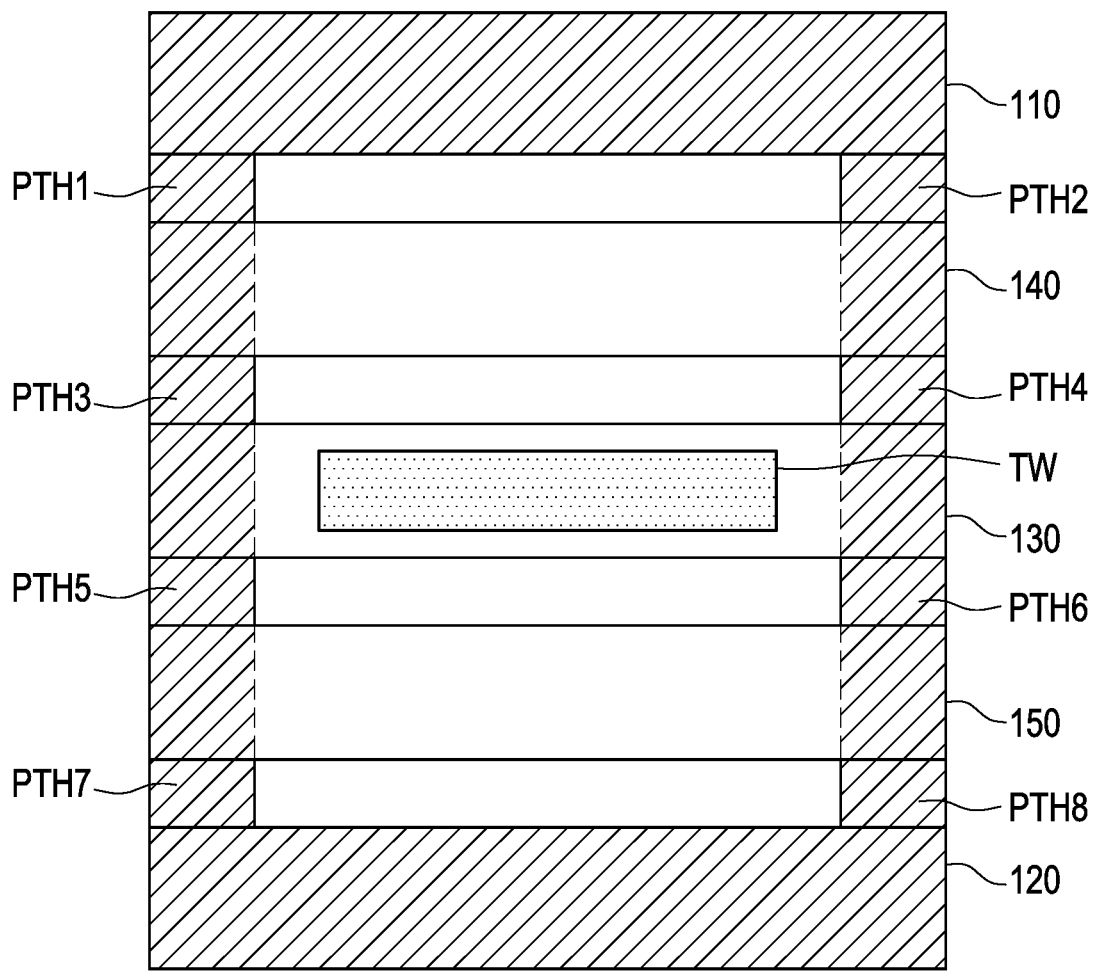
FIG. 1 illustrates a schematic diagram of a cross section view of a circuit board according to an embodiment of the present disclosure.

Please refer to FIG. 1, which illustrates a schematic diagram of a cross section view of a circuit board according to an embodiment of the present disclosure. The circuit board 100 includes a plurality of layers 110~150. The layer 110 may be formed on a top layer of the circuit board 100. The layer 110 is used as a first reference voltage plane. The layer 120 may be formed on a bottom layer of the circuit board 100, and the layer 120 is used as a second reference voltage plane. The first reference voltage plane may be used to receive a direct current (DC) reference voltage, such as a ground voltage. The second reference voltage plane may be also used to receive a direct current (DC) reference voltage. The first reference voltage plane and the second reference voltage plane may receive the same ground voltage.

The layers 130~150 may be formed between the layers 110 and 120. In this embodiment, the layer 130 may be a center layer and be formed between the layers 140 and 150. In this embodiment, the layers 140, 130 and 150 are formed between the layers 110 and 120 in sequence. The layer 140, 150 are a first intermediate layer and a second intermediate layer, respectively.

In this embodiment, a plurality of transmission wires may be disposed on the layer 130. In FIG. 1, one transmission wire TW of the transmission wires is illustrated. The transmission wire TW may be formed on a top surface of the layer 130, formed on a bottom surface of the layer 130 or formed on the layer 130. First ends of the transmission wires may commonly be coupled to a wireless signal transceiver, and second ends of the transmission wires may respectively be coupled to a plurality of antenna arrays, wherein each of the antenna arrays comprises a plurality of mm-wave antennas. The transmission wires are configured to transmit intermediate frequency (IF) signal between the wireless signal transceiver and the antenna arrays.

On the other hand, the layer 140 are formed between the layer 110 and the layer 130. The layer 150 are formed between the layer 120 and the layer 130. The layer 140 is configured to increase a distance between the first reference voltage plane on the layer 110 and the transmission wire TW on the layer 130. The layer 150 is also configured to increase a distance between the second reference voltage plane on the layer 120 and the transmission wire TW on the layer 130. By increasing the distance between the first reference voltage plane and the transmission wire TW, increasing the distance between the second reference voltage plane and the transmission wire TW, a width of the transmission wire TW can be increased correspondingly.

That is, by increasing the width of the transmission wire TW, a conductive loss of the IF signal transmission on the transmission wire TW can be reduced.

On the other hand, the circuit board 100 further includes a plurality of plating through holes PTH1~PTH8. In FIG. 1, the plating through holes PTH3 and PTH4 are disposed at two sides of the top surface of the layer 130, and the plating through holes PTH3 and PTH4 are configured to be coupled to the layer 140. The plating through holes PTH1 and PTH2 are disposed at two sides of the top surface of the layer 140, and the plating through holes PTH1 and PTH2 are respectively coupled to the plating through holes PTH3 and PTH4. The plating through holes PTH1 and PTH2 are also coupled to the layer 110 so as to couple to the first reference voltage plane.

The plating through holes PTH5 and PTH6 are disposed at two sides of the top surface of the layer 150, and the plating through holes PTH5 and PTH6 are respectively coupled to the plating through holes PTH3 and PTH4. Also, the plating through holes PTH5 and PTH6 are configured to be coupled to the layer 150. The plating through holes PTH7 and PTH8 are disposed at two sides of the top surface of the layer 120, and the plating through holes PTH7 and PTH8 are respectively coupled to the plating through holes PTH5 and PTH6. The plating through holes PTH7 and PTH8 are also coupled to the layer 120 so as to couple to the second reference voltage plane.

In this embodiment, the layers 110, 120 and the plating through holes PTH1~PTH8 form a reference voltage circumference, and the transmission wire TW is surrounded in the reference voltage circumference. Such as that, an electromagnetic wave energy of the IF signal transmitted on the transmission wire TW can be prevented from loss by the reference voltage circle. Also, the IF signal transmitted on the transmission wire TW also can be prevented from external interference by the reference voltage circumference.

Please be noted here, in this embodiment, a first area on the first intermediate layer (the layer 140) corresponding to a first vertical projection surface of the transmission wire TW including non-conductive materials. A second area on the second intermediate layer (the layer 150) corresponding to a second vertical projection surface of the transmission wires TW including non-conductive materials. That is, in the layer 140, there is no conductive material disposed above the transmission wire TW. Also, in the layer 150, there is no conductive material disposed under the transmission wire TW.

In this embodiment, heights of the layers 140 and 150 may be the same or different, and no more special limitation here.

In here, the circuit board 100 may a printed circuit board (PCB) or a flexible printed circuit board (FPC).

Figure 2A:
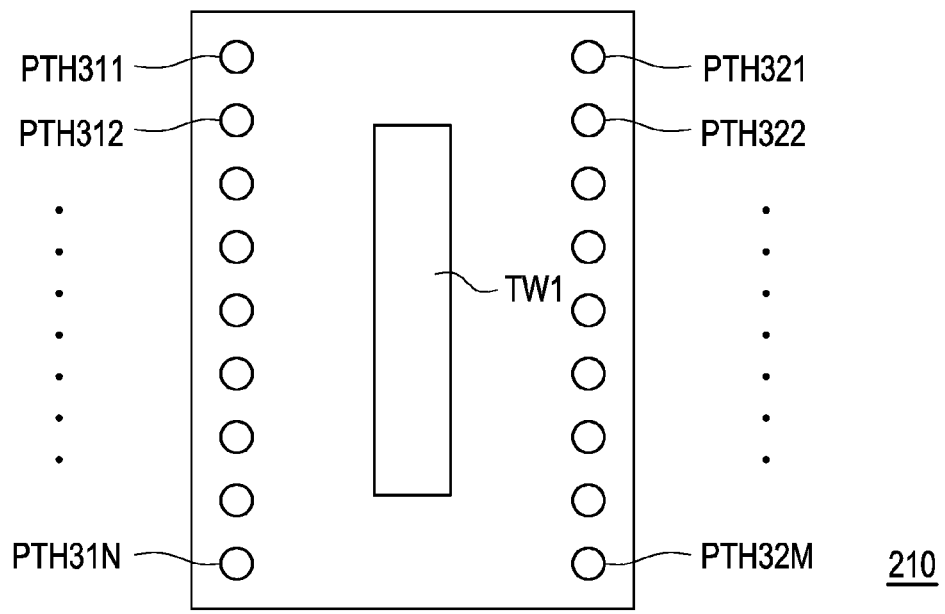
FIG. 2A and FIG. 2B respectively illustrate different layout plots of plating through holes of the circuit board according to embodiments of the present disclosure.
Figure 2B:
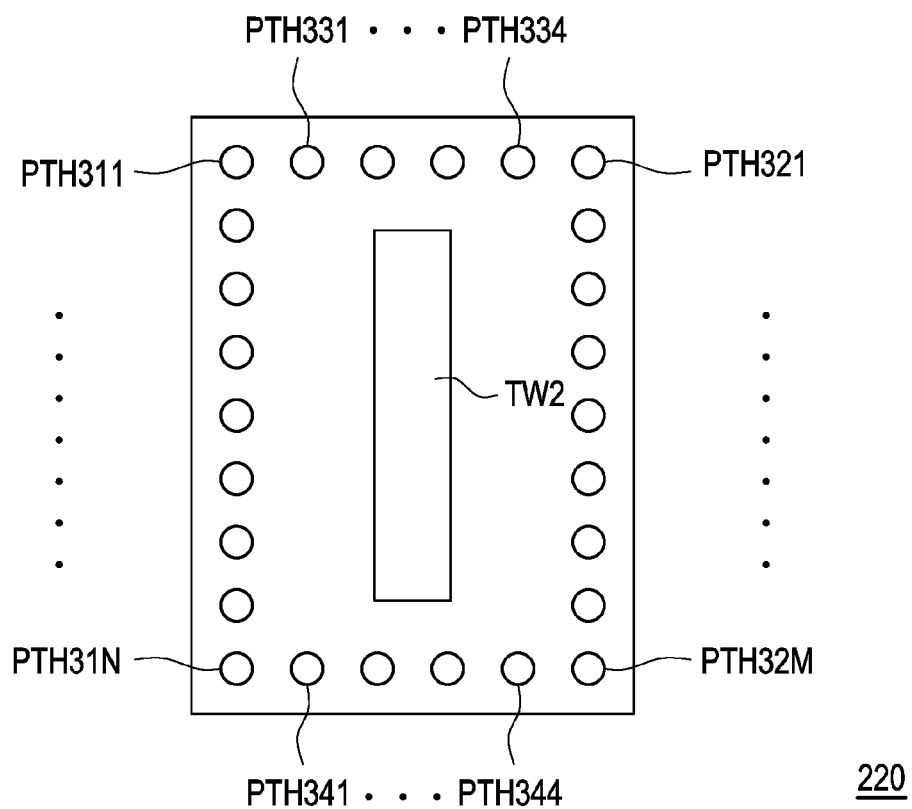

Please refer to FIG. 2A and FIG. 2B, which respectively illustrate different layout plots of plating through holes of the circuit board according to embodiments of the present disclosure. In FIG. 2A, a transmission wire TW1 is disposed on a layer 210. A plurality of the first plating through holes PTH311~PTH31N may be disposed at a first side of the layer 210, and a plurality of the second plating through holes PTH321~PTH32M may be disposed at a second side of the layer 210. The first side is opposite to the second side. In this embodiment, the first plating through holes PTH311~PTH31N may be arranged in a first line, and the second plating through holes PTH321~PTH32M may be arranged in a second line. The number of the first plating through holes PTH311~PTH31N and the number of the second plating through holes PTH321~PTH32M may be the same or different. In other embodiments, the first plating through holes PTH311~PTH31N may be arranged in several lines, and the second plating through holes PTH321~PTH32M may be arranged in several lines; there is no special limitation here.

In FIG. 2B, a transmission wire TW2 is disposed on a layer 220. A plurality of the first plating through holes PTH311~PTH31N may be disposed at a first side of the layer 220, and a plurality of the second plating through holes PTH321~PTH32M may be disposed at a second side of the layer 220. Furthermore, a plurality of the third plating through holes PTH331~PTH334 may be disposed at a third side of the layer 220, and a plurality of the fourth plating through holes PTH341~PTH344 may be disposed at a fourth side of the layer 220. In this embodiment, the first side is opposite to the second side, and the third side is opposite to the fourth side; the first side to the fourth side are different sides.

In this embodiment, any two of numbers of the first plating through holes PTH311~PTH31N, the second plating through holes PTH321~PTH32M, the third plating through holes PTH331~PTH334, and the fourth plating through holes PTH341~PTH344 may be the same or different.

Similar to FIG. 2A, in FIG. 2B, the first plating through holes PTH311~PTH31N may be arranged to one or several lines, the second plating through holes PTH321~PTH32M may be arranged to one or several lines, the third plating through holes PTH331~PTH334 may be arranged to one or several lines, and the fourth plating through holes PTH341~PTH344 also may be arranged to one or several lines.

Figure 3:
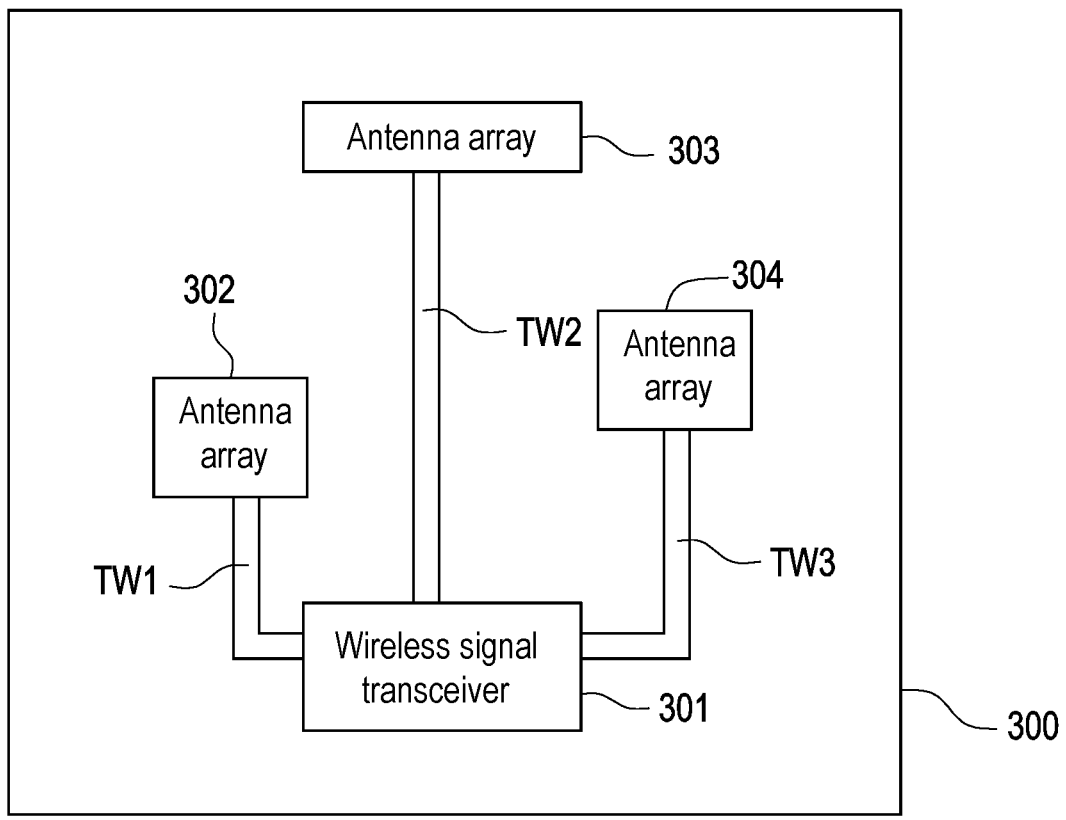
FIG. 3 illustrates a schematic diagram of a layout plot of transmission wires according to an embodiment of the present disclosure.

Please refer to FIG. 3, which illustrates a schematic diagram of a layout plot of transmission wires according to an embodiment of the present disclosure. In the present disclosure, transmission wires TW1~TW3 are disposed on a layer 300 of a circuit board. The first ends of transmission wires TW1~TW3 are coupled to a wireless signal transceiver 301, and the second ends of transmission wires TW1~TW3 are coupled to antenna arrays 302~304. The antenna arrays 302~304 may be respectively disposed on three different areas of the layer 300. One end of the transmission wire TW1 is coupled to the antenna arrays 302 and the other end of the transmission wire TW1 is coupled to the wireless signal transceiver 301; one end of the transmission wire TW2 is coupled to the antenna arrays 303 and the other end of the transmission wire TW2 is coupled to the wireless signal transceiver 301; and one end of the transmission wire TW3 is coupled to the antenna arrays 304 and the other end of the transmission wire TW3 is coupled to the wireless signal transceiver 301. Each of the antenna arrays 302~ includes a plurality of mm-wave antennas. The transmission wire TW1 is configured to transmit a first transmitted signal between the wireless signal transceiver 301 and the antenna array 302; the transmission wire TW2 is configured to transmit a second transmitted signal between the wireless signal transceiver 301 and the antenna array 303; and the transmission wire TW3 is configured to transmit a third transmitted signal between the wireless signal transceiver 301 and the antenna array 304. The first transmitted signal, the second transmitted signal and the third transmitted signal are all intermediate frequency signals.

It should be note here, in a circuit board, a conductive loss of each of the transmission wires TW1~TW3 can be determined by dielectric constant (DK), dissipation factor (DF) and width of each of the transmission wires TW1~TW3. In the present embodiment, when the dissipation factor DF is smaller or equal to 0.014, the conductive loss of each of the transmission wires TW1~TW3 is dominated by the width of each of the transmission wires TW1~TW3.

That is, the conductive loss of each of the transmission wires TW1~TW3 can be reduced by increasing the width of each of the transmission wires TW1~TW3. In the present disclosure, a total conductive loss of each of the transmission wires TW1~TW3 can be smaller than 5.2 dB when a transmitted signal is at 10 G hertz by setting the width of each of the transmission wires TW1~TW3 to 3.5 mil or larger.

Figure 4:
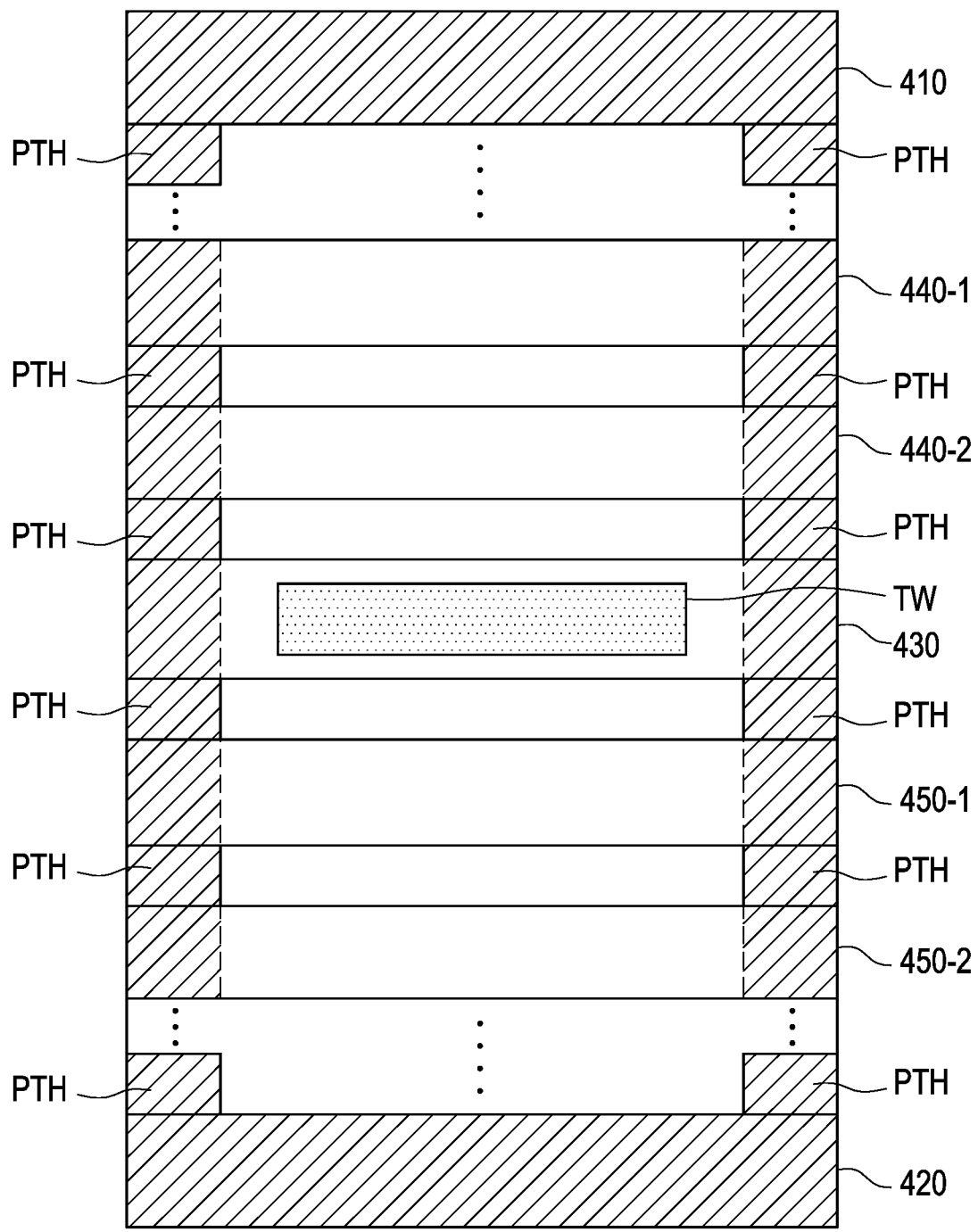
FIG. 4 illustrates a schematic diagram of a cross section view of a circuit board according to another embodiment of the present disclosure.

Please refer to FIG. 4, which illustrates a schematic diagram of a cross section view of a circuit board according to another embodiment of the present disclosure. The circuit board 400 includes a plurality of layers 410~450-2. The layer 410 may be formed on a top layer of the circuit board 400. The layer 410 is used as a first reference voltage plane. The layer 420 may be formed on a bottom layer of the circuit board 400, and the layer 420 is used as a second reference voltage plane. The first reference voltage plane and the second reference voltage plane may receive the same ground voltage.

The layers 430~450-2 may be formed between the layers 410 and 420. In this embodiment, the layer 430 may be a center layer and be formed between the layers 440-1, 440-2, 450-1 and 450-2. In this embodiment, a plurality of layers 440-1, 440-2 are used to be first intermediate layers and a plurality of layers 450-1, 450-2 are used to be second intermediate layers.

In the present disclosure, the number of the first intermediate layers and the second intermediate layers may be one or more, and can be determined by a designer of the circuit board 400.

On the other hand, the layers 430~450-2 can be coupled to a first reference voltage plane on the layer 410 and a second reference voltage plane on the layer 420 through a plurality of a plurality of plating through holes PTH. The plating through holes PTH may be disposed at sides of corresponding layer 430~450-2. Thus, a layout area for disposing the transmission wire TW will not be blocked by the plating through holes PTH on the layer 430.

In summary, the circuit board of the present disclosure provides at least one first intermediate layer and at least one second intermediate layer to be respectively disposed between a transmission wire and a first reference voltage plane, and between the transmission wire and a second reference voltage plane. Thus, a distance between the transmission wire and reference voltage planes can be increased, and the capacitive effect between the transmission wire and reference voltage planes can be reduced. A width of the transmission wire can be increased correspondingly, and a conductive loss of signal transmission on the transmission wire can be reduced.

What is claimed is:

1. A circuit board, comprising:
a first layer for using as a first reference voltage plane;
a second layer for using as a second reference voltage plane;
a plurality of transmission wires are disposed on a third layer, wherein the first ends of the plurality of transmission wires are coupled to a wireless signal transceiver, and the second ends of the plurality of transmission wires are coupled to a plurality of antenna arrays; wherein the third layer is disposed between the first layer and the second layer;

a plurality of plating through holes, disposed at sides of the third layer, wherein the plurality of plating through holes are configured to connect the first reference voltage plane with the second reference voltage plane; and
at least one first intermediate layer and at least one second intermediate layer, wherein the at least one first intermediate layer is disposed between the first layer and the third layer, and the at least one second intermediate layer is disposed between the second layer and the third layer, wherein the at least one first intermediate layer has a first area corresponding to a first vertical projection surface of the transmission wires, the first area includes non-conductive materials, the at least one second intermediate layer has a second area corresponding to a second vertical projection surface of the transmission wires, and the second area includes non-conductive materials, wherein a width of each of the transmission wires is set to 3.5 ml or larger, each of the transmission wires is configured to transmit an intermediate frequency signal, and a total conductive loss of each of the transmission wires is smaller than 5.2 dB when a transmitted signal is at 10 G hertz.

2. The circuit board as claimed in claim 1, wherein the plurality of plating through holes comprise a plurality of the first plating through holes disposed at a first side of the third layer, and a plurality of the second plating through holes disposed at a second side of the third layer; wherein the first side is opposite to the second side.

3. The circuit board as claimed in claim 2, wherein the plurality of plating through holes further comprises a plurality of the third plating through holes disposed at a third side of the third layer, and a plurality of the fourth plating through holes disposed at a fourth side of the third layer; wherein the third side is opposite to the fourth side, the first side is different from the third side.

4. The circuit board as claimed in claim 1, wherein the first reference voltage plane and the second reference voltage plane are set to receive a ground voltage.

5. The circuit board as claimed in claim 1, wherein each of the antenna arrays comprises a plurality of mm-wave antennas.

6. The circuit board as claimed in claim 1, wherein a conductive loss of each of the transmission wires is dominated by a width of each of the transmission wires.

7. The circuit board as claimed in claim 1, wherein the circuit board is a printed circuit board or a flexible printed circuit board.

* * * * *